US009064978B2
::::

(12) United States Patent
Hu et al.

(10) Patent No.: US 9,064,978 B2
(45) Date of Patent: Jun. 23, 2015

(54) PIXEL STRUCTURE AND FABRICATING METHOD THEREOF

(71) Applicant: Hannstar Display Corporation, New Taipei (TW)

(72) Inventors: Hsien-Tang Hu, Taichung (TW); Chang-Ming Chao, Taichung (TW); Mu-Kai Kang, Pingtung County (TW); Jui-Chi Lai, Kaohsiung (TW)

(73) Assignee: HannStar Display Corporation, Taipei (TW)

( * ) Notice: Subject to any disclaimer, the term of this patent is extended or adjusted under 35 U.S.C. 154(b) by 52 days.

(21) Appl. No.: 14/084,628

(22) Filed: Nov. 20, 2013

(65) Prior Publication Data

US 2015/0076486 A1   Mar. 19, 2015

(30) Foreign Application Priority Data

Sep. 17, 2013   (CN) .......................... 2013 1 0424654

(51) Int. Cl.
  *H01L 33/00*   (2010.01)
  *H01L 29/66*   (2006.01)
  *H01L 29/786*  (2006.01)

(52) U.S. Cl.
  CPC ........ H01L 33/0041 (2013.01); H01L 29/6675 (2013.01); H01L 29/7869 (2013.01)

(58) Field of Classification Search
  CPC ............ H01L 27/3244; H01L 29/4908; H01L 29/7831; H01L 29/786; H01L 29/78645; H01L 21/02505; H01L 27/10873; H01L 27/1251; H01L 27/1259; H01L 27/14603; H01L 28/60; H01L 29/41733; H01L 51/5203; G02F 1/136227; G02F 1/134336; G02F 2001/136295
  See application file for complete search history.

(56) References Cited

U.S. PATENT DOCUMENTS

| | | | |
|---|---|---|---|
| 7,981,708 B1 * | 7/2011 | Lee et al. .......... | 438/34 |
| 8,426,851 B2 * | 4/2013 | Morosawa et al. ............. | 257/43 |
| 8,593,607 B2 * | 11/2013 | Soda .............................. | 349/142 |
| 8,900,900 B2 * | 12/2014 | Chen et al. ...................... | 438/34 |
| 2007/0229748 A1 * | 10/2007 | Fujita ............................. | 349/141 |
| 2009/0294772 A1 * | 12/2009 | Jeong et al. ..................... | 257/59 |
| 2011/0024751 A1 * | 2/2011 | Yamazaki et al. .............. | 257/57 |
| 2011/0057187 A1 * | 3/2011 | Sakakura et al. ............... | 257/43 |
| 2011/0062433 A1 * | 3/2011 | Yamazaki ....................... | 257/43 |
| 2011/0068334 A1 * | 3/2011 | Yamazaki et al. .............. | 257/43 |
| 2011/0089419 A1 * | 4/2011 | Yamazaki et al. .............. | 257/43 |
| 2011/0210324 A1 * | 9/2011 | Sakakura et al. ............... | 257/43 |
| 2012/0199834 A1 * | 8/2012 | Jeon et al. ....................... | 257/59 |
| 2012/0217493 A1 * | 8/2012 | Lee et al. ........................ | 257/43 |
| 2015/0034943 A1 * | 2/2015 | Yu et al. .......................... | 257/43 |

* cited by examiner

*Primary Examiner* — Evan Pert
*Assistant Examiner* — Gustavo Ramallo
(74) *Attorney, Agent, or Firm* — Jianq Chyun IP Office

(57) ABSTRACT

The pixel structure includes a scan line, a data line, a thin-film transistor, a first electrode layer, a protective layer and a second electrode layer. The thin-film transistor is electrically connected to the scan line and the data line, and includes a gate, an oxide semiconductor layer, an insulating layer, a source and a drain. The first electrode layer is in the same layer as the oxide semiconductor layer, and is surrounded by the scan line and the data line. The second electrode layer is located on the first electrode layer, and the protective layer is located between the first electrode layer and the second electrode layer, wherein one of the first and second electrode layers is electrically connected to the thin-film transistor, and the other is connected to a common voltage. The second electrode layer includes a plurality of slits exposing an area of the first electrode layer.

17 Claims, 7 Drawing Sheets

PIXEL STRUCTURE AND FABRICATING METHOD THEREOF

CROSS-REFERENCE TO RELATED APPLICATION

This application claims the priority benefit of China application serial no. 201310424654.2, filed on Sep. 17, 2013. The entirety of the above-mentioned patent application is hereby incorporated by reference herein and made a part of this specification.

BACKGROUND OF THE INVENTION

1. Field of the Invention

The invention relates to a pixel structure and a fabricating method thereof, and particularly to a pixel structure that increases carrier mobility of a thin-film transistor and a fabricating method thereof.

2. Description of Related Art

As display technology advances, among various flat panel displays, liquid-crystal displays (LCDs) and organic electroluminescent displays (OELDs or OLEDs) have become the mainstream in the market because of their advantages such as light weight, slim size and low power consumption. In LCD and OLED techniques, a thin-film transistor is largely used, and a structure design or selection of materials thereof has a direct influence on performance of a product.

Generally, in the thin-film transistor, an N-type doped or P-type doped ohmic contact layer is usually formed on a channel layer, so as to reduce a contact resistance between the channel layer and the electrode such as a source or a drain. However, the channel layer and the ohmic contact layer in most conventional thin-film transistors are made of amorphous silicon (a-Si), and an amorphous silicon thin-film transistor has problems such as lower carrier mobility and poor reliability. Accordingly, the application of the amorphous silicon thin-film transistor is limited in many respects.

SUMMARY OF THE INVENTION

The invention directs to provide a pixel structure including an oxide semiconductor channel layer.

The invention also directs to provide a fabricating method of a pixel structure, which improves carrier mobility of a thin-film transistor.

The invention provides a pixel structure including a scan line, a data line, a thin-film transistor, a first electrode layer, a protective layer and a second electrode layer. The scan line and the data line are disposed on a substrate. The thin-film transistor is disposed on the substrate, and is electrically connected to the scan line and the data line. The thin-film transistor includes a gate, an oxide semiconductor layer, an insulating layer, a source and a drain. The gate is disposed on the substrate. The oxide semiconductor layer is disposed on the gate. The insulating layer covers a channel region of the oxide semiconductor layer. The source and the drain are disposed on the insulating layer and respectively electrically connected to the oxide semiconductor layer. The first electrode layer is in the same layer as the oxide semiconductor layer, and is surrounded by the scan line and the data line. The protective layer covers the source, the drain, the oxide semiconductor layer, the first electrode layer and the substrate. The second electrode layer is disposed on the first electrode layer, and the protective layer is located between the first electrode layer and the second electrode layer, wherein one of the first and second electrode layers is electrically connected to the thin-film transistor, and the other is connected to a common voltage. The second electrode layer includes a plurality of slits exposing an area of the first electrode layer.

The invention also provides a fabricating method of a pixel structure. The fabricating method includes the following steps. A scan line and a gate are formed on a substrate. An oxide semiconductor layer and a first electrode layer are formed on the substrate. The first electrode layer is in the same layer as the oxide semiconductor layer. The oxide semiconductor layer is disposed on the gate and includes a channel region. A source, a drain and a data line are formed on the substrate. The first electrode layer is surrounded by the scan line and the data line. The source and the drain are respectively electrically connected to the oxide semiconductor layer, wherein the gate, the oxide semiconductor layer, the source and the drain form a thin-film transistor, and the thin-film transistor is electrically connected to the scan line and the data line. A protective layer is formed to cover the source, the drain, the oxide semiconductor layer, the first electrode layer and the substrate. A second electrode layer is formed on the first electrode layer, and the protective layer is located between the first electrode layer and the second electrode layer, wherein one of the first and second electrode layers is electrically connected to the thin-film transistor, and the other is connected to a common voltage, and wherein the second electrode layer includes a plurality of slits exposing an area of the first electrode layer.

In another embodiment of the invention, a method of forming the scan line and the gate includes forming a first conductive material layer on the substrate, and patterning the first conductive material layer to form the scan line and the gate.

In another embodiment of the invention, the method of forming a pixel structure further includes forming a gate insulating layer. The gate insulating layer covers the gate and is located between the gate and the oxide semiconductor layer.

In another embodiment of the invention, a method of forming the oxide semiconductor layer and the first electrode layer includes forming an oxide semiconductor material layer on the substrate, and patterning the oxide semiconductor material layer to form the oxide semiconductor layer and the first electrode layer, wherein the oxide semiconductor layer is located on the gate and the first electrode layer is surrounded by the scan line and the data line. The fabricating method of a pixel structure further includes forming an insulating layer on the oxide semiconductor layer. The insulating layer covers the channel region of the oxide semiconductor layer. A method of forming the source, the drain and the data line includes forming a second conductive material layer on the substrate so that the second conductive material layer covers the insulating layer, and patterning the second conductive material layer to form the source, the drain and the data line.

In another embodiment of the invention, the fabricating method of a pixel structure further includes performing a surface modification treatment on the first electrode layer. The surface modification treatment includes an argon plasma process or a hydrogen plasma process.

In each embodiment of the invention, the first electrode layer is electrically connected to the thin-film transistor, and the second electrode layer is connected to the common voltage.

In each embodiment of the invention, a method of forming the first electrode layer includes making the first electrode layer in direct contact with the drain of the thin-film transistor.

In each embodiment of the invention, the second electrode layer is electrically connected to the thin-film transistor, and the first electrode layer is connected to the common voltage.

In each embodiment of the invention, the fabricating method of a pixel structure further includes forming a contact opening in the protective layer to expose the drain, and filling the second electrode layer into the contact opening so that the second electrode layer is in contact with the drain of the thin-film transistor.

In each embodiment of the invention, materials of the oxide semiconductor layer include indium gallium zinc oxide (IGZO), indium tin zinc oxide (ITZO), indium gallium oxide (IGO) or indium zinc oxide (IZO).

Based on the above, in the pixel structure according to the embodiments of the invention, the first electrode layer and the oxide semiconductor layer are in the same layer. By using the oxide semiconductor layer as a channel of the thin-film transistor, the carrier mobility of the thin-film transistor is improved. Moreover, advantages such as increase in a response speed of the thin-film transistor, reduction of occurrence of leakage current, enhancement of reliability, decrease in size of the thin-film transistor, increase in pixel aperture ratio of a panel, lowering of power consumption, and easier realization of a design with high resolution are provided. In addition, in the pixel structure according to the embodiments of the invention, the electrode in the pixel structure for driving a display medium is composed of oxide semiconductor. Accordingly, the connection between the oxide semiconductor electrode and the thin-film transistor does not require a contact opening. As a result, the situations in which the pixel aperture ratio is limited by disposition of the contact opening are eliminated.

To make the above features and advantages of the invention more comprehensible, embodiments accompanied with drawings are described in detail as follows.

DESCRIPTIONS OF EMBODIMENTS

Figure 1:
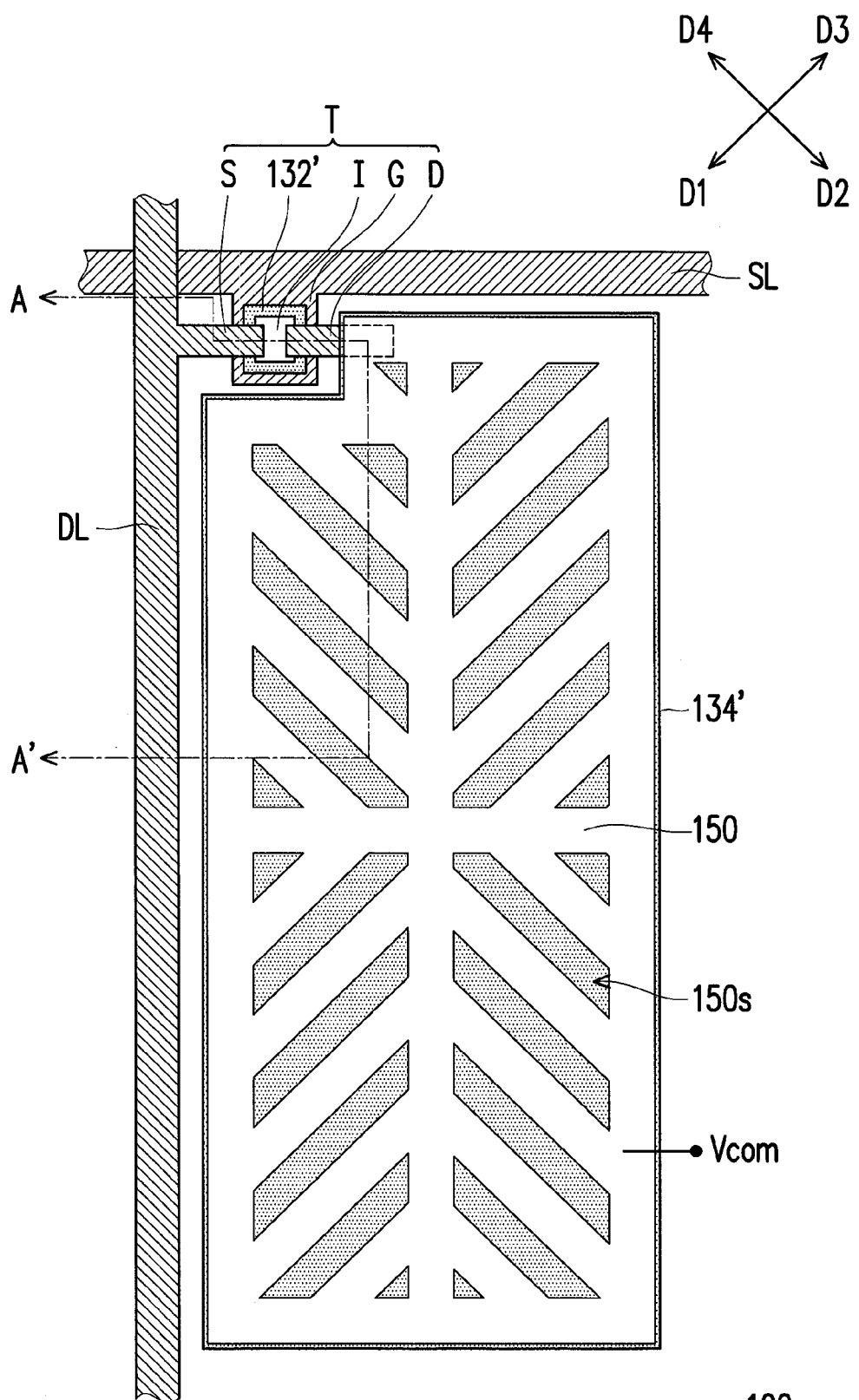
FIG. 1 is a schematic top view of a pixel structure according to the first embodiment of the invention.

FIG. 1 is a schematic top view of a pixel structure according to the first embodiment of the invention. FIGS. 2A to 2E are schematic cross-sectional views of a fabricating method of the pixel structure taken along a line A-A' in FIG. 1.

Figure 2A:
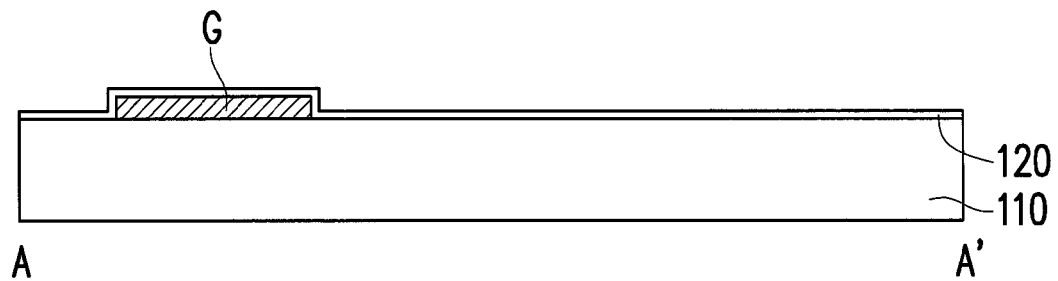
FIGS. 2A to 2E are schematic cross-sectional views of a fabricating method of the pixel structure taken along a line A-A' in FIG. 1.
Figure 2B:
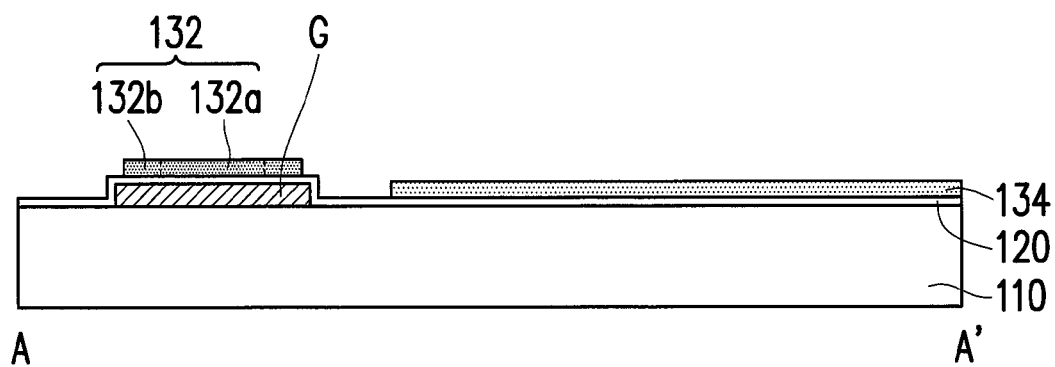
Figure 2C:
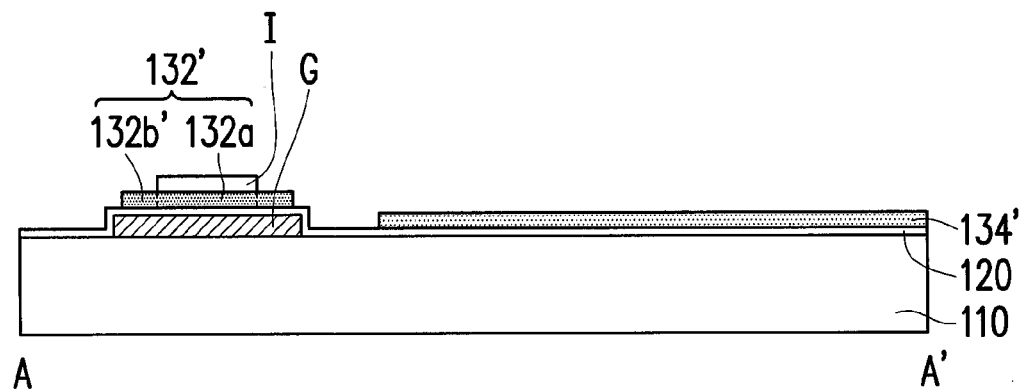
Figure 2D:
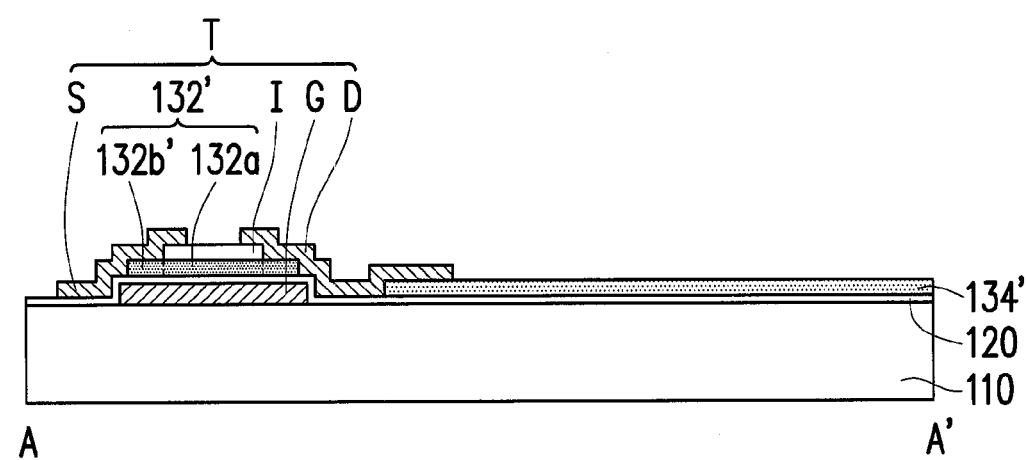
Figure 2E:
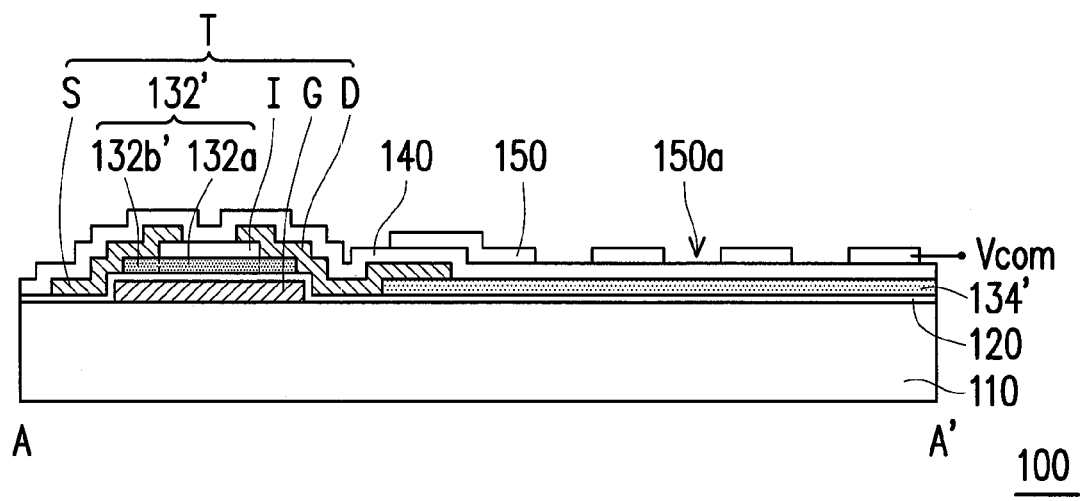

Referring to both FIG. 1 and FIG. 2E, a pixel structure 100 includes a substrate 110, a scan line SL, a data line DL, a thin-film transistor T, a first electrode layer 134', a protective layer 140 and a second electrode layer 150.

The scan line SL and the data line DL are disposed on the substrate 110. Extension directions of the scan line SL and the data line DL are different from each other. In the present embodiment, the extension direction of the scan line SL is perpendicular to the extension direction of the data line DL. However, the invention is not limited thereto. In addition, the scan line SL and the data line DL are in different layers, and sandwich an insulating layer (not illustrated) therebetween. The scan line SL and the data line DL are mainly used to transmit a signal required for driving the pixel structure 100. Generally, the scan line SL and the data line DL are made of metal materials. However, the invention is not limited thereto. According to other embodiments, the scan line SL and the data line DL may also be made of other conductive materials, such as alloys, oxides of metal materials, nitrides of metal materials, nitric-oxides of metal materials or stacked layers of metal materials and other conductive materials. In addition, a material of the substrate 110 is, for example, glass, quartz, organic polymer or metal.

The thin-film transistor T is disposed on the substrate 110, and is electrically connected to the scan line SL and the data line DL. The thin-film transistor T includes a gate G, a gate insulating layer 120, an oxide semiconductor layer 132', an insulating layer I, a source S and a drain D. In the present embodiment, the thin-film transistor T is, for example, a bottom-gate thin-film transistor. However, in other embodiments, a top-gate thin-film transistor may be employed.

The gate G is disposed on the substrate 110, and is electrically connected to the scan line SL. Accordingly, when a control signal is input into the scan line SL, the signal is received by the gate G through the scan line SL. The gate insulating layer 120 covers the gate G and the substrate 110, and is located between the gate G and the oxide semiconductor layer 132'. A material of the gate insulating layer 120 is, for example, an inorganic material, an organic material, or a combination thereof. The inorganic material includes silicon oxide, silicon nitride, silicon oxynitride, or a stacked layer of at least two of the above materials.

The oxide semiconductor layer 132' is disposed on the gate G, and includes a channel region 132a' and a plurality of contact regions 132b', wherein the channel region 132a' is located between the contact regions 132b'. Materials of the oxide semiconductor layer 132' include indium gallium zinc oxide (IGZO), indium tin zinc oxide (ITZO), indium gallium oxide (IGO), indium zinc oxide (IZO) or other suitable materials.

The insulating layer I covers the channel region 132a' of the oxide semiconductor layer 132', so as to expose the contact regions 132b'. A material of the insulating layer I is, for example, an inorganic material, an organic material, or a combination thereof. The inorganic material includes silicon oxide, silicon nitride, silicon oxynitride, or a stacked layer of at least two of the above materials.

The source S and the drain D are disposed on the insulating layer I, and are respectively electrically connected to the contact regions 132b'. More in detail, the source S and the drain D are disposed on the insulating layer I, the contact regions 132b' of the oxide semiconductor layer 132', and the gate insulating layer 120, and are respectively in contact with the corresponding contact regions 132b'. Moreover, the source S is electrically connected to the data line DL. Accordingly, when the control signal is input into the data line DL, the data line DL is electrically conducted with the source S.

The first electrode layer 134' is disposed on the gate insulating layer 120. Materials of the first electrode layer 134' include indium gallium zinc oxide (IGZO), indium tin zinc oxide (ITZO), indium gallium oxide (IGO), indium zinc oxide (IZO) or other suitable materials. In the present embodiment, the first electrode layer 134' and the oxide semiconductor layer 132' are, for example, in the same layer.

The protective layer 140 covers the source S, the drain D, the oxide semiconductor layer 132', the first electrode layer 134', the gate insulating layer 120 and the substrate 110. A material of the protective layer 140 is, for example, an inorganic material, an organic material, or a combination thereof. The inorganic material includes silicon oxide, silicon nitride, silicon oxynitride, or a stacked layer of at least two of the above materials.

The second electrode layer 150 is disposed on the first electrode layer 134', and the protective layer 140 is located between the first electrode layer 134' and the second electrode layer 150. Moreover, the second electrode layer 150 includes a plurality of slits 150s exposing an area of the first electrode layer 134'. The present embodiment illustrates an example in which the slits 150s of the second electrode layer 150 extend along only one direction. However, the invention is not limited thereto. The slits 150s may also respectively extend along a plurality of different directions to form a plurality of alignment domains, extend along other directions or include slits in other suitable shapes, which is well known to people skilled in the art, and thus that no further description in this regard is provided herein. Materials of the second electrode layer 150 include indium tin oxide (ITO) or other suitable transparent conductor materials.

It is worth mentioning that in the present embodiment, the first electrode layer 134' is electrically connected to the thin-film transistor T, and the second electrode layer 150 is connected to a common voltage Vcom, wherein the second electrode layer 150 is electrically insulated from the thin-film transistor T. More in detail, the first electrode layer 134' is in direct contact with the drain D of the thin-film transistor T. The drain D of the thin-film transistor T, for example, extends onto the first electrode layer 134', and covers a portion of the first electrode layer 134'. In the present embodiment, since a pixel region of the pixel structure 100 has no contact opening, such pixel structure design increases pixel aperture ratio, and also eliminates a photomask process so that cost is reduced.

It is also worth mentioning that in the invention, an oxide semiconductor material is used as a replacement for an amorphous silicon material used for a channel layer and an ohmic contact layer in a conventional thin-film transistor. Moreover, the oxide semiconductor layer is used as a replacement for the channel layer and the ohmic contact layer in the conventional thin-film transistor (i.e. two layers are replaced by one layer). Also, the source and the drain are respectively in direct contact with and electrically connected to the contact regions of the oxide semiconductor layer. In addition, the first electrode layer and the oxide semiconductor layer are in the same layer and made of the same material. Therefore, the design of the pixel structure according to the embodiment of the invention improves carrier mobility of the thin-film transistor, and also has advantages such as increasing a response speed of the thin-film transistor, reducing occurrence of leakage current, enhancing reliability, decreasing size of the thin-film transistor, increasing pixel aperture ratio of a panel, lowering power consumption, and more easily realizing a design with high resolution. The first electrode composed of the oxide semiconductor does not require a contact opening for being connected to the thin-film transistor, which thus helps to avoid situations in which the pixel aperture ratio is limited by disposition of the contact opening.

In addition, the pixel structure 100 of the invention is, for example, applicable to a vertical alignment-fringe field switching (VA-FFS) mode liquid-crystal display panel. Due to a voltage difference between the first electrode layer 134' and the second electrode layer 150, a fringe electric field is formed to drive liquid-crystal molecules to incline toward a direction of an electric field. Accordingly, the pixel structure 100 has characteristics of both high contrast in a vertical alignment mode and wide viewing angle in a fringe field switching mode. However, the invention is not limited thereto. The pixel structure 100 of the invention is also applicable to an in-plane switching (IPS) mode liquid-crystal display panel or other suitable display panels.

In the following, a fabricating method of the pixel structure 100 in the present embodiment is further described in detail. FIGS. 2A to 2E are schematic cross-sectional views of a fabricating method of the pixel structure 100 taken along a line A-A' in FIG. 1.

Referring to both FIG. 1 and FIG. 2A, first, the scan line SL and the gate G are formed on the substrate 110. A method of forming the scan line SL and the gate G includes forming a first conductive material layer (not illustrated) on the substrate 110, and patterning the first conductive material layer to form the scan line SL and the gate G. The patterning is achieved by, for example, a photolithography and etching process. Next, the gate insulating layer 120 is formed to cover the gate G and the substrate 110.

Referring to both FIG. 1 and FIG. 2B, then, an oxide semiconductor material layer (not illustrated) is formed on the substrate 110. The oxide semiconductor material layer is patterned to form an oxide semiconductor portion 132 and a first electrode portion 134. The patterning is achieved by, for example, a photolithography and etching process. More in detail, the oxide semiconductor portion 132 is located above the gate G, and the oxide semiconductor portion 132 and the first electrode portion 134 are not in contact with each other. The oxide semiconductor portion 132 includes a channel region 132a and a plurality of contact regions 132b, wherein the channel region 132a is located between the contact regions 132b.

Referring to both FIG. 1 and FIG. 2C, after that, the insulating layer I is formed on the oxide semiconductor portion 132, and covers the channel region 132a of the oxide semiconductor portion 132, so as to expose the contact regions 132b. Next, a surface modification treatment is performed on at least the first electrode portion 134, so as to form the contact regions 132b' of the oxide semiconductor layer 132' and the first electrode layer 134'. Here, the surface modification treatment includes an argon plasma process or a hydrogen plasma process. Accordingly, the oxide semiconductor layer 132' and the first electrode layer 134' are formed on the substrate 110, and the oxide semiconductor layer 132' and the first electrode layer 134' are in the same layer. The oxide semiconductor layer 132' is disposed on the gate G, and the gate insulating layer 120 is located between the gate G and the oxide semiconductor layer 132'. The oxide semiconductor layer 132' includes the channel region 132a and a plurality of the contact regions 132b', wherein the channel region 132a is located between the contact regions 132b'. It is worth mentioning that through the aforementioned surface modification treatment, the contact regions 132b' of the oxide semiconductor layer 132' and the first electrode layer 134' have better conductor characteristics, while the channel region 132a maintains semiconductor characteristics due to being covered by the insulating layer I.

Referring to both FIG. 1 and FIG. 2D, next, the source S, the drain D and the data line DL are formed on the substrate 110. A method of forming the source S, the drain D and the data line DL includes forming a second conductive material layer (not illustrated) on the substrate 110 so that the second conductive material layer covers the insulating layer I, and patterning the second conductive material layer to form the source S, the drain D and the data line DL. The patterning is achieved by, for example, a photolithography and etching process. Accordingly, the source S and the drain D are respectively electrically connected to the contact regions 132b' of the oxide semiconductor layer 132', wherein the gate G, the oxide semiconductor layer 132', the source S and the drain D form the thin-film transistor T, and the thin-film transistor T is electrically connected to the scan line SL and the data line DL.

It is worth mentioning that in the present embodiment, the drain D of the thin-film transistor T, for example, extends onto the first electrode layer 134', and covers a portion of the first electrode layer 134', so that the first electrode layer 134' is in direct contact with and electrically connected to the drain D of the thin-film transistor T.

Referring to both FIG. 1 and FIG. 2E, then, the protective layer 140 is formed to cover the source S, the drain D, the oxide semiconductor layer 132', the first electrode layer 134' and the substrate 110. Next, the second electrode layer 150 is formed on the first electrode layer 134', and the protective layer 140 is located between the first electrode layer 134' and the second electrode layer 150, wherein the first electrode layer 134' is electrically connected to the thin-film transistor T, and the second electrode layer 150 is connected to the common voltage Vcom. Moreover, the second electrode layer 150 includes a plurality of the slits 150s exposing the area of the first electrode layer 134'.

In the first embodiment of the invention, the first electrode layer 134' is electrically connected to the thin-film transistor T, and the second electrode layer 150 is connected to the common voltage Vcom. However, the invention is not limited thereto. It is satisfactory as long as one of the first and second electrode layers is electrically connected to the thin-film transistor T, and the other is connected to the common voltage Vcom. For example, in other embodiments of the invention (e.g. as shown in the second embodiment), it may be that the second electrode layer is connected to the thin-film transistor T, and the first electrode layer is connected to the common voltage Vcom.

Figure 3:
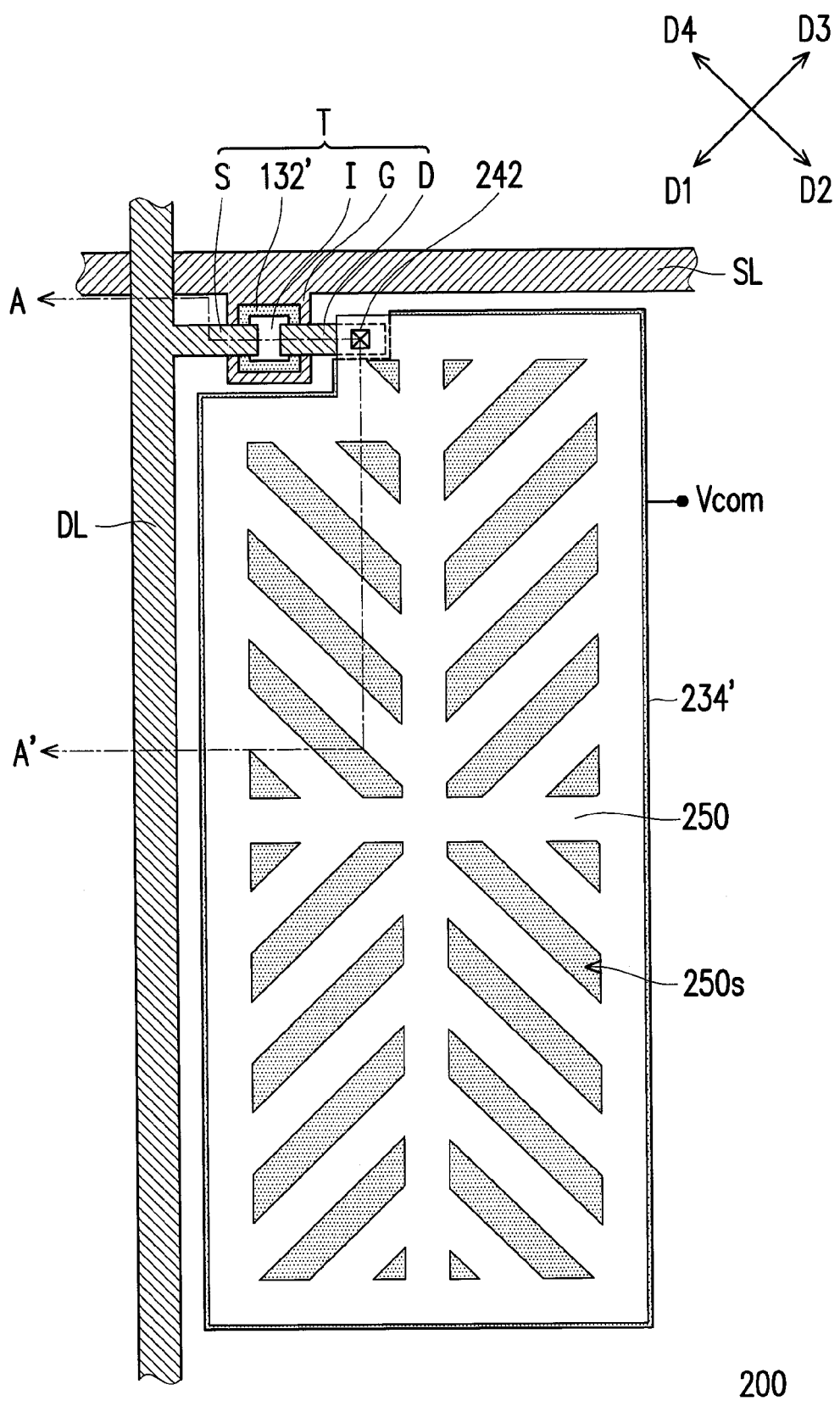
FIG. 3 is a schematic top view of a pixel structure according to the second embodiment of the invention.
Figure 4A:
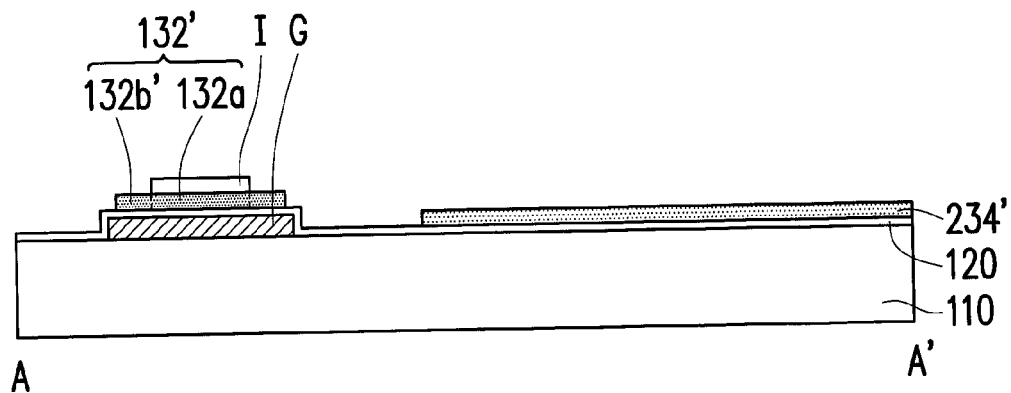
FIGS. 4A to 4C are schematic cross-sectional views of a fabricating method of the pixel structure taken along a line A-A' in FIG. 3.
Figure 4B:
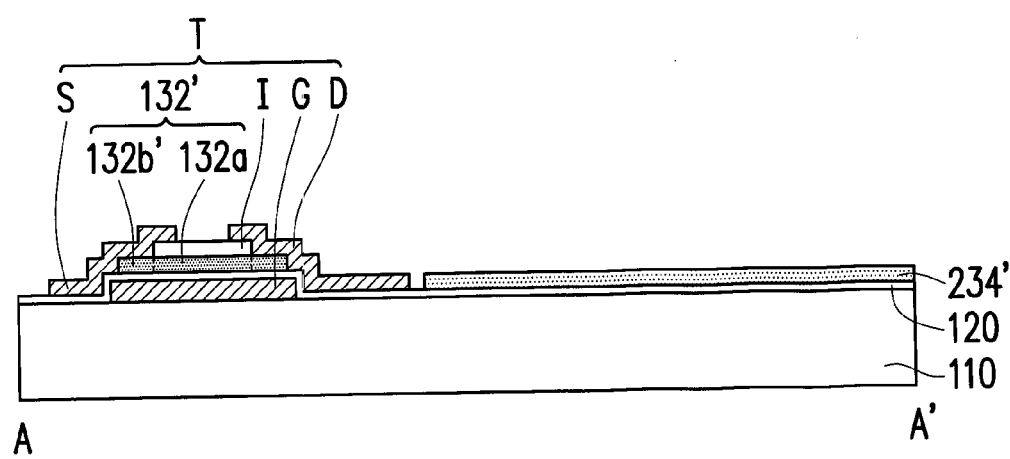
Figure 4C:
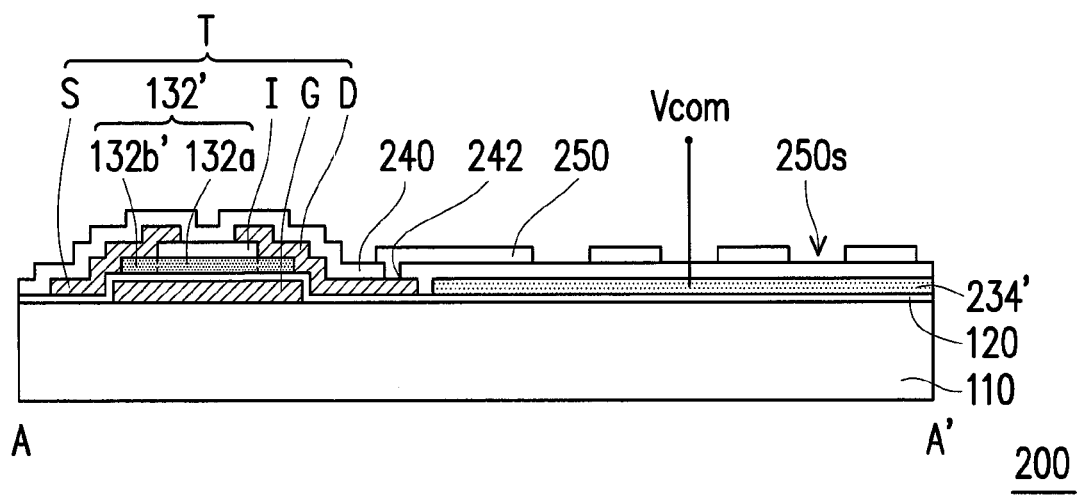

FIG. 3 is a schematic top view of a pixel structure according to the second embodiment of the invention. FIGS. 4A to 4C are schematic cross-sectional views of a fabricating method of the pixel structure taken along a line A-A' in FIG. 3. The embodiments of FIG. 3 and FIG. 4C are similar to those of FIG. 1 and FIG. 2E. Thus, the same or similar elements are indicated by the same or similar reference numerals, and descriptions thereof are not repeated herein. A difference between the designs of FIG. 3 and FIG. 4C and those of FIG. 1 and FIG. 2E lies in that the electrode layers electrically connected to the thin-film transistor T and the common voltage Vcom are different.

Referring to both FIG. 3 and FIG. 4C, in a pixel structure 200, a second electrode layer 250 includes a plurality of slits 250s exposing an area of a first electrode layer 234'. The second electrode layer 250 is electrically connected to the thin-film transistor T, and the first electrode layer 234' is connected to the common voltage Vcom, wherein the first electrode layer 234' is electrically insulated from the thin-film transistor T. More in detail, a protective layer 240 has a contact opening 242. The contact opening 242 exposes the drain D of the thin-film transistor T, and the second electrode layer 250 is filled into the contact opening 242 so as to be in contact with the drain D of the thin-film transistor T.

In the following, a fabricating method of the pixel structure 200 in the present embodiment is further described in detail. FIGS. 4A to 4C are schematic cross-sectional views of the fabricating method of the pixel structure 200 taken along the line A-A' in FIG. 3. First, a structure in FIG. 4A is formed. The structure and a fabricating method thereof are similar to those in FIG. 2C. Thus, the same or similar elements are indicated by the same or similar reference numerals, and descriptions thereof are not repeated herein.

Referring to both FIG. 3 and FIG. 4B, next, the source S, the drain D and the data line DL are formed on the substrate 110. Accordingly, the source S and the drain D are respectively electrically connected to the contact regions 132b' of the oxide semiconductor layer 132', wherein the gate G, the oxide semiconductor layer 132', the source S and the drain D form the thin-film transistor T, and the thin-film transistor T is electrically connected to the scan line SL and the data line DL. It is worth mentioning that in the present embodiment, the drain D of the thin-film transistor T does not extend onto the first electrode layer 234'. Therefore, the first electrode layer 234' is electrically insulated from the thin-film transistor T.

Referring to both FIG. 3 and FIG. 4C, then, the protective layer 240 is formed to cover the source S, the drain D, the oxide semiconductor layer 132', the first electrode layer 234' and the substrate 110. The protective layer 240 has the contact opening 242. The contact opening 242 exposes a portion of the drain D of the thin-film transistor T. Next, a second electrode layer 250 is formed on the first electrode layer 234', and the protective layer 240 is located between the first electrode layer 234' and the second electrode layer 250, wherein the second electrode layer 250 is electrically connected to the thin-film transistor T, and the first electrode layer 234' is connected to the common voltage Vcom. More in detail, the second electrode layer 250 is filled into the contact opening 242 so as to be in contact with the drain D of the thin-film transistor T. Moreover, the second electrode layer 250 includes a plurality of the slits 250s exposing the area of the first electrode layer 234'.

In summary of the above, in the pixel structure and the fabricating method thereof provided by the invention, the oxide semiconductor layer includes the channel region and a plurality of the contact regions, wherein the source and the drain are respectively electrically connected to the contact regions, and the first electrode layer and the oxide semiconductor layer are in the same layer. Since the source and the drain are respectively in direct contact with and electrically connected to the contact regions of the oxide semiconductor layer, and the first electrode layer and the oxide semiconductor layer are in the same layer, carrier mobility of the thin-film transistor is improved. Moreover, advantages such as increase in a response speed of the thin-film transistor, reduction of occurrence of leakage current, enhancement of reliability, decrease in size of the thin-film transistor, increase in pixel aperture ratio of a panel, lowering of power consumption, and easier realization of a design with high resolution are provided. In addition, in the pixel structure in the embodiments of the invention, the electrode in the pixel structure for driving a display medium is composed of oxide semiconductor. Accordingly, the connection between the oxide semiconductor electrode and the thin-film transistor does not require a contact opening. As a result, situations in which the pixel aperture ratio is limited by disposition of the contact opening are eliminated.

Although the invention has been described with reference to the above embodiments, it will be apparent to one of ordinary skill in the art that modifications to the described embodiments may be made without departing from the spirit of the invention. Accordingly, the scope of the invention will be defined by the attached claims and not by the above detailed descriptions.

What is claimed is:

1. A pixel structure characterized by comprising:
   a scan line and a data line, disposed on a substrate;
   a thin-film transistor disposed on the substrate and electrically connected to the scan line and the data line, the thin-film transistor comprising:
   a gate disposed on the substrate;
   an oxide semiconductor layer disposed on the gate;
   an insulating layer covering a channel region of the oxide semiconductor layer; and a source and a drain, disposed on the insulating layer and respectively electrically connected to the oxide semiconductor layer;

a first electrode layer in the same layer as the oxide semiconductor layer, surrounded by the scan line and the data line;

a protective layer covering the source, the drain, the oxide semiconductor layer, the first electrode layer and the substrate; and a second electrode layer disposed on the first electrode layer, the protective layer being located between the first electrode layer and the second electrode layer, wherein one of the first and second electrode layers is electrically connected to the thin-film transistor, and the other is connected to a common voltage, and wherein the second electrode layer comprises a plurality of slits exposing an area of the first electrode layer.

2. The pixel structure according to claim 1, wherein the first electrode layer is electrically connected to the thin-film transistor, and the second electrode layer is connected to the common voltage.

3. The pixel structure according to claim 2, wherein the first electrode layer is in direct contact with the drain of the thin-film transistor, and the protective layer completely covers the drain.

4. The pixel structure according to claim 1, wherein the second electrode layer is electrically connected to the thin-film transistor, and the first electrode layer is connected to the common voltage.

5. The pixel structure according to claim 4, wherein the protective layer has a contact opening exposing the drain, and the second electrode layer is filled into the contact opening to be in contact with the drain of the thin-film transistor.

6. The pixel structure according to claim 1, further comprising a gate insulating layer covering the gate and located between the gate and the oxide semiconductor layer.

7. The pixel structure according to claim 1, wherein materials of the oxide semiconductor layer comprise indium gallium zinc oxide (IGZO), indium tin zinc oxide (ITZO), indium gallium oxide (IGO) or indium zinc oxide (IZO).

8. A fabrication method of a pixel structure, characterized by comprising:

forming a scan line and a gate on a substrate;

forming an oxide semiconductor layer and a first electrode layer on the substrate, the first electrode layer being in the same layer as the oxide semiconductor layer, the oxide semiconductor layer being disposed on the gate and comprising a channel region;

forming a source, a drain and a data line on the substrate, the first electrode layer being surrounded by the scan line and the data line, the source and the drain being respectively electrically connected to the oxide semiconductor layer, wherein the gate, the oxide semiconductor layer, the source and the drain form a thin-film transistor, and the thin-film transistor is electrically connected to the scan line and the data line;

forming a protective layer covering the source, the drain, the oxide semiconductor layer, the first electrode layer and the substrate; and forming a second electrode layer on the first electrode layer, the protective layer being located between the first electrode layer and the second electrode layer, wherein one of the first and second electrode layers is electrically connected to the thin-film transistor, and the other is connected to a common voltage, and wherein the second electrode layer comprises a plurality of slits exposing an area of the first electrode layer.

9. The fabricating method of a pixel structure according to claim 8, wherein a method of forming the scan line and the gate comprises forming a first conductive material layer on the substrate, and patterning the first conductive material layer to form the scan line and the gate.

10. The fabricating method of a pixel structure according to claim 8, further comprising forming a gate insulating layer covering the gate and located between the gate and the oxide semiconductor layer.

11. The fabricating method of a pixel structure according to claim 8, wherein a method of forming the oxide semiconductor layer and the first electrode layer comprises:

forming an oxide semiconductor material layer on the substrate; and patterning the oxide semiconductor material layer to form the oxide semiconductor layer and the first electrode layer, wherein the oxide semiconductor layer is located above the gate and the first electrode layer is surrounded by the scan line and the data line.

12. The fabricating method of a pixel structure according to claim 11, further comprising:

forming an insulating layer on the oxide semiconductor layer to cover the channel region of the oxide semiconductor layer.

13. The fabricating method of a pixel structure according to claim 12, wherein a method of forming the source, the drain and the data line comprises forming a second conductive material layer on the substrate to cover the insulating layer, and patterning the second conductive material layer to form the source, the drain and the data line.

14. The fabricating method of a pixel structure according to claim 8, further comprising performing a surface modification treatment on the first electrode layer, the surface modification treatment comprising an argon plasma process or a hydrogen plasma process.

15. The fabricating method of a pixel structure according to claim 8, wherein a method of forming the first electrode layer comprises making the first electrode in direct contact with the drain of the thin-film transistor.

16. The fabricating method of a pixel structure according to claim 8, further comprising forming a contact opening in the protective layer to expose the drain, and filling the second electrode layer into the contact opening so that the second electrode layer is in contact with the drain of the thin-film transistor.

17. The fabricating method of a pixel structure according to claim 8, wherein materials of the oxide semiconductor layer comprise indium gallium zinc oxide (IGZO), indium tin zinc oxide (ITZO), indium gallium oxide (IGO) or indium zinc oxide (IZO).

\* \* \* \* \*